United States Patent
Jain et al.

(10) Patent No.: US 7,032,197 B2
(45) Date of Patent: Apr. 18, 2006

(54) SYSTEM AND METHOD FOR EXECUTING IMAGE COMPUTATION ASSOCIATED WITH A TARGET CIRCUIT

(75) Inventors: Jawahar Jain, Santa Clara, CA (US); Subramanian K. Iyer, Austin, TX (US); Amit Narayan, Redwood City, CA (US); Debashis Sahoo, Stanford, CA (US); Christian Stangier, Los Altos, CA (US)

(73) Assignee: Fujitsu Limited, Kawasaki (JP)

( * ) Notice: Subject to any disclaimer, the term of this patent is extended or adjusted under 35 U.S.C. 154(b) by 340 days.

(21) Appl. No.: 10/454,207

(22) Filed: Jun. 4, 2003

(65) Prior Publication Data

US 2004/0093572 A1   May 13, 2004

Related U.S. Application Data

(60) Provisional application No. 60/426,207, filed on Nov. 13, 2002.

(51) Int. Cl.
G06F 17/50 (2006.01)

(52) U.S. Cl. .................................. 716/5; 716/4; 716/7
(58) Field of Classification Search ............... 716/4–5, 716/7
See application file for complete search history.

(56) References Cited

U.S. PATENT DOCUMENTS

| | | | |
|---|---|---|---|
| 5,680,332 A * | 10/1997 | Raimi et al. ................. 703/13 |
| 6,026,222 A * | 2/2000 | Gupta et al. .................... 716/5 |
| 6,086,626 A | 7/2000 | Jain et al. ........................ 716/5 |
| 6,212,669 B1 * | 4/2001 | Jain ............................... 716/7 |
| 6,292,916 B1 | 9/2001 | Abramovici et al. ......... 714/736 |
| 6,308,299 B1 | 10/2001 | Burch et al. .................... 716/4 |
| 6,321,186 B1 | 11/2001 | Yuan et al. .................... 703/15 |
| 6,473,884 B1 | 10/2002 | Ganai et al. .................... 716/3 |
| 6,499,129 B1 | 12/2002 | Srinivasan et al. ............. 716/4 |

OTHER PUBLICATIONS

Richard Rudell, "Dynamic Variable Ordering for Ordered Binary Decision □□Diagrams", IEEE/ACM International Conf. On CAD-93, Nov. 7-11, 1993, pp. 42-47.*

Jerry R. Burch, et al., "Symbolic Model Checking for Sequential Circuit □□Verification", IEEE Transactions on Computer-Aided Design of Integrated □□Circuits and Systems, vol. 13, No. 4, Apr. 1994, pp. 401-424.*

(Continued)

*Primary Examiner*—Vuthe Siek
*Assistant Examiner*—Brandon Bowers
(74) *Attorney, Agent, or Firm*—Baker Botts L.L.P.

(57) ABSTRACT

A method for verifying a property associated with a target circuit is provided that includes receiving information associated with a target circuit, the information identifying a property within the target circuit to be verified. One or more operations may be executed in order to generate a set of transition relations for performing a reachability analysis associated with the target circuit. An image associated with the target circuit may be partitioned into a plurality of leaves that may each represent a subset of a final image to be generated by a partitioned ordered binary decision diagram (POBDD) data structure. An analysis may be computed of one or more of the leaves using a selected one or both of conjunction and quantification operations separately.

24 Claims, 2 Drawing Sheets

OTHER PUBLICATIONS

Randal E. Bryant, "Symbolic Boolean Manipulation with Ordered Binary-Decision Diagrams", ACM Computing Surveys, vol. 24, No. 3, Sep. 1992, pp. 293-318.*

David E. Long, "Model Checking, Abstraction, and Compositional Verification", submitted to the Thesis Committee at the School of Computer Science, Pittsburgh, PA, Jul. 1993, pp. 131-141.*

G. Cabodi, P. Camurati, S. Quer, "Improved Reachability Analysis of Large Finite State Machines," IEEE ICCAD, 1996.

* cited by examiner

SYSTEM AND METHOD FOR EXECUTING IMAGE COMPUTATION ASSOCIATED WITH A TARGET CIRCUIT

RELATED APPLICATIONS

This application claims priority under 35 U.S.C. §119 of provisional patent application Ser. No. 60/426,207 entitled: "Verifying a Circuit Using One or More Partitioned Ordered Binary Decision Diagrams (POBDDs)" filed Nov. 13, 2002.

TECHNICAL FIELD OF THE INVENTION

This invention relates in general to the field of integrated circuit verification and more particularly to a system and method for executing image computation associated with a target circuit.

BACKGROUND OF THE INVENTION

Integrated circuits have become increasingly prevalent in today's society. The number of digital systems that include integrated circuits continues to steadily increase and may be driven by a wide array of products and systems. Added functionalities may be provided to integrated circuits in order to execute additional tasks or to effectuate more sophisticated operations in their respective applications or environments. Additionally, system parameters of integrated circuits may dictate that their operations be performed in an optimal time interval, which allows for even more operations to be accommodated in a given clock cycle. These rigorous demands associated with production and design generally result in the need for more advanced and complex verification processes and procedures.

Verification techniques are generally implemented in order to ensure that an integrated circuit or a digital element is capable of performing its intended functionality. In other cases, verification techniques may be used in order to ascertain whether a selected characteristic, behavior, or property is present in a given target circuit. Flaws or inaccuracies in an integrated circuit or a digital element may inhibit system functionality and/or cause significant operational problems in a corresponding architecture.

In integrated circuit and other digital applications, a reachability analysis poses a significant problem. A reachability analysis may include a conjunction phase and a quantification phase that cooperate in order to produce an image computation for a reachability analysis in a given circuit. Either of these phases may present significant obstacles during operations. For example, graphs may become excessively large or 'blowup' during a given analysis. Such a blowup is impractical for system designers because it may generate a host of time intensive activities or tasks. Additionally, such a result may not be feasible to evaluate because it forces a designer to exhaustively investigate the blowup to ensure correctness or accuracy associated with that portion of a target circuit. Accordingly, the ability to verify or validate a design for any integrated circuit or digital element presents a significant challenge to digital system designers and integrated circuit manufacturers.

SUMMARY OF THE INVENTION

From the foregoing, it may be appreciated by those skilled in the art that a need has arisen for an improved image computation approach that offers the ability to properly verify a target circuit in order to ensure that it includes some property or that it is capable of performing its intended functionality. In accordance with one embodiment of the present invention, a system and method for executing an image computation for a target circuit are provided that substantially eliminate or greatly reduce disadvantages and problems associated with conventional computation techniques.

According to one embodiment of the present invention, there is provided a method verifying a property associated with a target circuit that includes receiving information associated with a target circuit, the information identifying a property within the target circuit to be verified. One or more operations may be executed in order to generate a set of transition relations for performing a reachability analysis associated with the target circuit. An image associated with the target circuit may be partitioned into a plurality of leaves that may each represent a subset of a final image to be generated by a partitioned ordered binary decision diagram (POBDD) data structure. An analysis may be computed of one or more of the leaves using a selected one or both of conjunction and quantification operations separately.

Certain embodiments of the present invention may provide a number of technical advantages. For example, according to one embodiment of the present invention, an image computation approach is provided that is significantly faster than other computation approaches. This may be a result of a procedure that is executed over a partitioned structure. The partitioned structure may implement the use of separate orders. Additionally, because each subset of an image may be transferred the instant it is complete, even in cases where certain subsets blowup, the method has already computed some other orthogonal subsets that were not as difficult. Such an approach may lead to a partial image analysis that allows for the partial verification of difficult properties associated with a target circuit. This offers a practical functionality for verification tools in a plethora of integrated circuit environments.

Another technical advantage associated with one embodiment of the present invention relates to flexibility. The present approach may be used in any formal verification tool that uses any type of BDDs. Such flexibility allows the present approach to be implemented in conjunction with a wide array of BDD applications. Additionally, such an approach can accommodate a diverse range of architectures and systems in executing a verification approach for a target circuit. Moreover, the present approach may be used to parallelize non-POBDD based image computations. Certain embodiments of the present invention may enjoy some, all, or none of these advantages. Other technical advantages may be readily apparent to one skilled in the art from the following figures, description, and claims.

BRIEF DESCRIPTION OF THE DRAWINGS

To provide a more complete understanding of the present invention and features and advantages thereof, reference is made to the following description, taken in conjunction with the accompanying figures, wherein like reference numerals represent like parts, in which.

DETAILED DESCRIPTION OF EXAMPLE EMBODIMENTS

Figure 1:
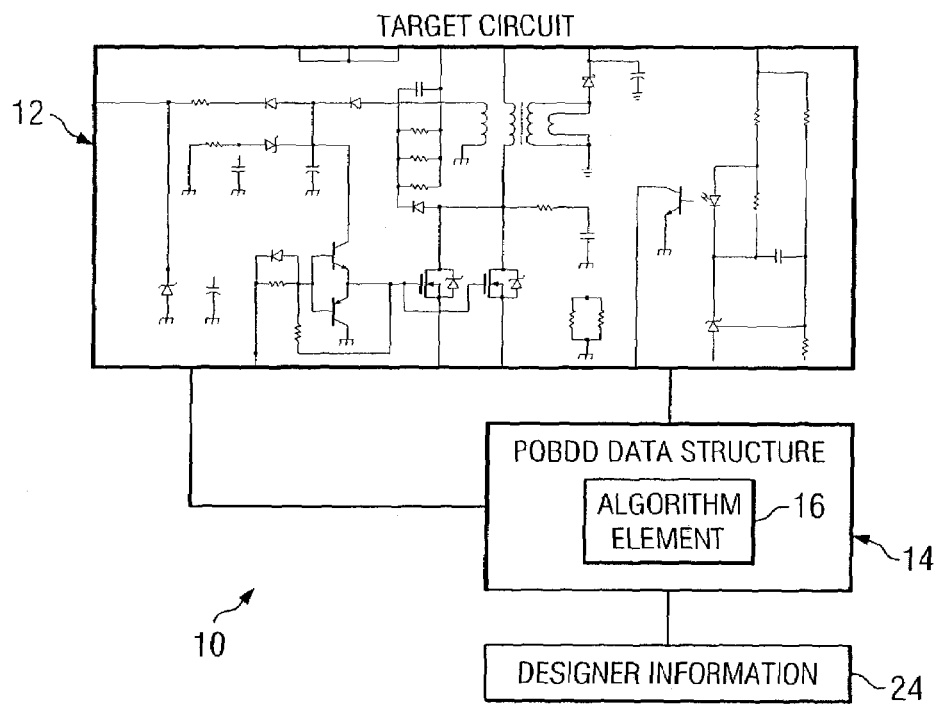
FIG. 1 is a simplified block diagram of a system for executing image computation in accordance with one embodiment of the present invention.

FIG. 1 is a simplified block diagram of a system 10 for executing an image computation associated with a target circuit 12. System 10 may include a partitioned ordered binary decision diagram (POBDD) data structure 14 that includes an algorithm element 16. Additionally, system 10 may include a segment of designer information 24 that may be communicated to POBDD data structure 14 and which may reflect any particular information sought to be input or tested by an end user. System 10 may generally be positioned within, or otherwise operate in conjunction with, any integrated circuit, digital element, processing configurations, or binary architecture in which verification procedures or processes may be implemented. Additionally, system 10 may be provided in cooperation with any device, component, hardware, software, object, or element associated with digital processing of information or data.

According to the teachings of the present invention, system 10 operates to provide a verification process capable of reaching significant depths in sub-spaces of target circuit 12. System 10 may execute local partitioning in the context of an image computation associated with target circuit 12. In image computation, the conjunction may be a difficult operation, whereby quantification represents a simpler segment of the computation process. After quantification, typically the graphs associated with the analysis become smaller. In general, the graphs of data structures may be generated to represent a given function. When the data structure of a BDD becomes too large such that it holds too much information it may be interpreted as excessively large. Such a scenario may be described or termed as a local blowup.

If the conjunction can be made easier, then the entire computation problem may also be made easier. By creating a partitioned-BDD like data structure (POBDD data structure 14), the conjunction bottleneck may be effectively eliminated. Each segment (or leaf) of a given POBDD may be a subset of the final image (and inclusive of conjunction and quantification operations having already been completed). Each leaf or subset of the image may be transferred to a separate manager after computation has been executed. Each leaf may be computed separately using (where appropriate) a separate variable order. The splitting operation may be executed on primary inputs, state variables, or local decomposition variables for example.

System 10 operates to disjunct images under a common order. The disjunction represents an inexpensive operation and is more direct than other verification approaches. The conjunction/quantification is also faster because it is generally being executed over a partitioned structure (potentially using separate orders). Additionally, because each subset of the image is transferred as soon as it is complete, even in the case of subset blowup, the operation has already computed some other orthogonal subsets that may be difficult. This allows system 10 to be used in a partial image analysis. This may further allow for partial verification of difficult properties, which represents a practical functionality for verification tools and procedures.

Additionally, system 10 provides a verification platform that may accommodate a number of diverse architectures sought to be verified. System 10 provides a formal verification tool that may use any type of BDDs in the verification process. Moreover, system 10 may be useful in order to parallelize non-POBDD based image computations. System 10 may also significantly increase the speed of any reachability procedure. Such enhancements in speed may help to create faster verification tools and may assist in generating semi-formal verification tools in accordance with particular needs.

System 10 may provide a verification architecture that is significantly faster than other verification or simulation techniques. This may be due, in part, to the integration of local partitioning into the verification process. In certain embodiments, such a verification approach may extend reachability parameters associated with target circuit 12. New or unexplored deep states within target circuit 12, that would otherwise not be visited, may be more quickly uncovered using system 10. Deep states are generally neglected in using satisfiability (SAT) procedures, or BDD operations to execute verification of a given target circuit. System 10 can accommodate a more complete analysis, which allows verification to be executed deep into circuits where other methods are restricted.

Target circuit 12 is an electronic or digital object sought to be tested in order to verify that it operates according to its prescribed or intended functionality. The integrity, validity, or design specifications of a sub-space within target circuit 12 may be analyzed using POBDD data structure 14. Target circuit 12 may include any associated circuitry, inclusive of logic gates, counters, inverters, buffers, or any other suitable devices, components, or objects capable of cooperating or interacting with target circuit 12. Target circuit 12 may alternatively be any other suitable device, component, architecture, arrangement, hardware, software, object or element capable of processing binary data or digital information in a verification environment. Target circuit 12 may be designed specifically to include (or be capable of performing) some property. The term 'property' as used herein in this document is inclusive of any capability, characteristic, operation, action, or behavior that may be associated with target circuit 12. In operation, target circuit 12 may be verified or otherwise validated in order to ensure that it maintains its designated property or characteristic, or that it performs a prescribed operation properly.

POBDD data structure 14 is an element operable to execute partitioning of BDD elements in a binary or digital environment. POBDD data structure 14 is a representation of a Boolean function for manipulation. As referred to herein, POBDD data structure 14 may be inclusive of a partitioned reduced order binary decision diagram (PROBDD) or BDD data structures (potentially with partitioning) where appropriate. The terms PROBDD and POBDD are interchangeable and generally represented in various suitable fashions (for purposes of brevity in certain cases) in describing their applications. POBDD data structure 14 may receive designer information 24 and perform a preliminarily analysis on target circuit 12 in order to retrieve a first set of states based on designer information 24. The first set of states from a sampled sub-space may then be used in order to augment or otherwise enhance the capabilities of system 10. POBDD data structure 14 may invoke one or more algorithms included in algorithm element 16 in order to evaluate a selected property associated with target circuit 12.

POBDDs are generally canonical and, therefore, may be used for combinational equivalence checking. POBDDs may be successively applied in reachable analyses for sequential circuit verification. Reachable state sets may be represented as POBDDs. This minimizes the memory requirement by only keeping one partition in a corresponding memory during a given time interval. Additionally, fixed point computations may be performed on each partition separately using reachability algorithms, which may be included within algorithm element 16, in conjunction with POBDD protocols that are effectuated by POBDD data structure 14.

POBDD data structure 14 is generally faster than other approaches used in verification operations. Moreover, the partitioned structure of POBDD data structure 14 is compact and may provide for much easier parallelization. Additionally, POBDD data structure 14 may offer dynamic partitioning that avoids memory deterioration, which may also be referred to in certain applications as 'memory blowup.' POBDD data structure 14 may cover a large volume of states within target circuit 12 quickly and, further, break designs into loosely coupled sets of interacting finite state machines.

In operation of an example embodiment, a designer or a manufacturer may write some program that identifies a property, characteristic, operation, or behavior that is sought to be tested or verified in target circuit 12. The property or characteristic may be suitably written in a particular syntax before it is communicated to POBDD data structure 14. The program may then be properly communicated to POBDD data structure 14, whereby POBDD data structure 14 tests the specified property in target circuit 12.

Algorithm element 16 is a data processing object that may include one or more algorithms that allow for a specific or designated property to be explored or verified in target circuit 12. Algorithm element 16 may be included within POBDD data structure 14 or provided external thereto in accordance with particular processing needs or arrangements. Additionally, algorithm element 16 may communicate with any other external component that provides one or more instructions or characteristics to be used in verifying sub-spaces within target circuit 12. Moreover, algorithm element 16 may directly receive designer information 24 in order to verify one or more properties associated with target circuit 12. Designer information 24 may also include or specify the type of circuit or element being subjected to the verification process. Algorithm element 16 may include any suitable hardware, software, objects, or elements operable to facilitate the verification operations being executed by POBDD data structure 14. In one embodiment, algorithm element 14 includes any suitable processors that may be used to analyze each partition created as subset of the final image.

In operation of an example embodiment, POBDD data structure 14 may be invoked in order to initiate the verification process. A parameter may be communicated or provided to POBDD data structure 14 and a time interval may also be selected for a given program. Transition relations may be constructed in order to execute a reachability analysis associated with target circuit 12. POBDD data structure 14 may begin dividing sub-spaces and determine whether a sub-space may be identified that allows for exploration at a selected depth. Each member of the set may be conjuncted, whereby a blowup may occur. When a variable is taken and subjected to partitioning, it may be split into multiple partitions. The partitions may be referred to as leaves. Thus, POBDD data structure 14 may be provided to include leaves that represent a subset of the final image. Each partition may be considered valid in and of itself and each may reflect part of the final image.

The partitioning may be executed on carefully selected variables. Each leaf may be computed (including both conjunction and quantification operations) separately using a separate variable order (where appropriate). Separate managers may then be invoked in order to analyze each partition or leaf. Because each leaf (or partition) may be dealt with differently based on its particular characteristics (e.g. the corresponding variable order), for a particular partition, a specific processor (separate manager) may be provided. When the particular computation has been completed, the corresponding leaf may be viewed as ready or finished. Thus, each leaf may be processed separately (and concurrently where appropriate) and then all leaves may be combined into a Boolean OR (disjuncted) and provided to a single manager. Alternatively, the leaves may be left as separate entities. Certain partitions may be combined into a single BDD where appropriate and the rest may be pushed forward as global partitions.

This operation may provide an inexpensive procedure, whereby all images are disjuncted (i.e. ORed) under a common order. Additionally, each subset of the image may be transferred the instant it is completed such that even in cases where some subsets blowup, the operation has already computed other orthogonal subsets that were not as difficult. This procedure may lead to a partial image analysis. Additional details relating to this procedure are provided below with reference to FIGS. 2 and 3.

For purposes of example and teaching it is useful to provide a further explanation of some of the algorithms that may be used in verifying selected properties associated with sub-spaces of target circuit 12. Many operations for the manipulation of Boolean functions can be performed efficiently for functions represented by OBDDs. For example, some of the basic operations are provided by:

1. Evaluation. For an OBDD G representing f and an input a compute the value f(a).
2. Reduction. For an OBDD G compute the equivalent reduced OBDD.
3. Equivalence test. Test whether two functions represented by OBDDs are equal.
4. Satisfiability problems. Problems may include:
   Satisfiability. For an OBDD G representing f find an input a for which f(a)=1 or output that no such input exists.
   SAT-Count. For an OBDD G representing f, compute the number of inputs a for which f(a)=1.
5. Synthesis (also referred to as apply). For functions f and g represented by an OBDD G include into G a representation for f$\hat{X}$g where $\hat{X}$ is a binary Boolean operation (e.g., $\wedge$).
6. Replacements (also called Substitution).
   Replacement by constants. For a function f represented by an OBDD, for a variable $x_i$ and a constant $c \in \{0, 1\}$ compute an OBDD for $f_{|x_i=c}$.
   Replacement by functions. For functions f and g represented by an OBDD and for a variable $x_i$ compute an OBDD for $f_{|x_i=g}$.
7. Universal quantification and existential quantification. For a function f represented by an OBDD and for a variable $x_i$ compute an OBDD for $(\forall x_i:f):=f_{|x_i=0} \wedge f_{|x_i=1}$ or $(\exists x_i:f):=f_{|x_i=0} \vee f_{|x_i=1}$, respectively.

In OBDD packages the operation reduction is usually integrated into the other operations such that only reduced OBDDs are represented. Many applications of OBDDs concern functions given as circuits. Hence, one important operation is the computation of an OBDD for a function given by a circuit, which is usually performed by the symbolic simulation of the circuit. This means that OBDDs for the functions representing the input variables are constructed. This may be easy because an OBDD for the function $x_i$ merely consists of a node labeled by $x_i$ with the 0-sink as 0-successor and the 1-sink as 1-successor. The circuit may be evaluated in some topological order (each gate is considered after all its predecessors have been considered) and a computation is made for each gate. The computation is a representation of the function at its output by combining the OBDDs representing the functions at its input using the synthesis operation.

Another possibility is that a given circuit is built of larger blocks. In such a case, OBDDs may be computed for the functions computed by each block and combine the OBDDs with the operation replacement by functions. In the case of computed OBDDs, for the functions represented by two circuits, the equivalence operation for OBDDs may be applied in order to test the circuits for equivalence.

In applications such as Boolean matching, signatures for the considered functions may be computed. A signature is a property of a function that can be computed efficiently and that is likely to be different for different functions. Signatures can be used to detect that given functions are different. A very simple signature is the number of satisfying inputs of a function. The operation SAT-count may be applied in order to compute this and other signatures where appropriate.

For purposes of teaching and example, some of the principles and concepts associated with POBDD, PROBDD, and BDD operations are provided below. The proffered description is only being provided to assist in the understanding of some of the complex theorems associated with partitioned BDD technology. The description should not be construed to limit any of the operations of any of the elements of system 10. It is imperative to recognize that the following description is for purposes of example only and should not be interpreted to restrict any other suitable operations that may be executed by POBDD data structure 14 or any other element involved in partitioning operations or the verification process.

In order to describe partitioned ROBDDs, it is useful to consider the following example. Assume a Boolean function $f: B^n B$ defined over n inputs $X_n = \{x_1, \ldots, x_n\}$. The partitioned-ROBDD representation $X_f$ of f is defined as follows:

Given a Boolean function: $f:B^n \rightarrow B$ defined over $X_n$, a partitioned-ROBDD representation $X_f$ of f is a set of k function pairs, $\chi_f = \{(\omega_1, \bar{f}_1) \ldots, (\omega_k, \bar{f}_k)\}$ where, $\omega_i B^n \rightarrow B$ and $\bar{f}_i:B^n \rightarrow B$, for $1 \leq i \leq k$, are also defined over $X_n$ and satisfy the following conditions:

1. $w_i$ and $\bar{f}_i$ are represented as ROBDDs with the variable ordering $\pi_i$, for $1 \leq i \leq k$.
2. $w_1 + w_2 + \ldots + w_k = 1$
3. $\bar{f}_i = w_i \wedge f$, for $1 \leq i \leq k$ In the example provided, + and $\wedge$ represent Boolean OR and AND respectively. The set $\{w_1, \ldots, W_k\}$ is denoted by W.

Each $w_i$ may be referred to as a window function. Intuitively, a window function $w_i$ may represent a part of the Boolean space over which f is defined. Every pair $(w_j, \bar{f}_j)$ may represent a partition of the function f. In, the example, the term "partition" is not being used in the sense where partitions have to be disjoint. If, in addition to conditions 1–3 (provided above), $w_i \wedge w_j = 0$ for $i \neq j$, then the partitions may be orthogonal. Each $(w_j, \bar{f}_j)$ may now be considered a partition in a conventional sense.

In constructing partitioned ROBDDs, the performance of partitioned ROBDDs generally depends on the ability to generate effective partitions of the Boolean space over which the function can be compactly represented. The issue of finding adequate partitions of the Boolean space is central to the partitioned-ROBDD representation. Described herein are example heuristics, which may be effective in generating compact, orthogonally partitioned-ROBDDs. Although a Boolean net list is used in the present approach, the techniques described are general and may be applied or extended to any arbitrary sequence of Boolean operations.

In an example BDD partitioning approach, the number of windows may be decided either a priori or dynamically. After a window $w_i$ is decided, a partitioned-ROBDD corresponding to it may be obtained by composing F in the Boolean space corresponding to the window $w_i$. In partitioning, the BDD for some function F, a decomposed BDD representation (i.e., a BDD which is not in terms of input variables but in terms of some pseudo-input variables that are created in the process of building BDDs for the given target function F) is considered. To create the partitioned BDD for F, its corresponding decomposed BDD may be analyzed to yield the partitions. The partition decision may be typically taken because the decomposed BDD for F in terms of its decomposition points, $\Psi_1, \ldots, \Psi_k$ cannot be composed. Note, the partitioned BDD for F, from its decomposed BDD, may be created in following three ways:

(1) Partition using input variables. The number of input variables may be changed dynamically or can be set to a predetermined constant.

(2) Partition using "internal" variables, i.e., variables that are not input variables. Such variables can be pseudo-variables introduced at internal gates.

(3) Partition using a suitable combination of 1 and 2.

At any given point in time in the present filtering based verification process a decomposed representation may be reflected by, $f_d(\Psi, X)$, of F where $\Psi=\{\psi_1, \ldots, \psi_k\}$ is called a decomposition set and it corresponds to the internal cut set selected, typically, by the naive cut or the smart cut process, and each $\psi_i \in \Psi$. is a decomposition point. Let $\Psi_{bdd} = \{\psi_{1_{bdd}}, \ldots, \psi_{k_{bdd}}\}$ represent the array containing the ROBDDs of the decomposition points, i.e., each $\psi_i \in \Psi$. has a corresponding ROBDD, $\psi_{i_{bdd}} \in \Psi_{bdd}$, in terms of primary input variables as well as (possibly) other $.\psi_j \in \Psi.$, where $\psi_j \neq \psi_i$. Similarly, the array of $=104_{i_{bdd}w_i}$ may be represented by $\Psi_{i_{bdd}w_i}$. The composition [?] of $.\psi_i$ in $f_d(\Psi, X)$ may be denoted by $f_d(\Psi,X)\cdot(\Psi_i \leftarrow \psi_{i_{bdd}})$, where, $$f_d(\Psi,X)\cdot(\psi_i \leftarrow \psi_{i_{bdd}}) = \overline{\psi_{i_{bdd}}} f_{d_{\overline{\psi i}} + \psi_{i_{bdd}}} \eta_{d''\psi i} \quad (1)$$

The vector composition of the $\Psi$ in $f_d(\Psi, X)$ may be denoted by $f_d(\psi, X)\cdot(\psi \leftarrow \psi_{bdd})$ and may represent a successive composition of $\psi_i$'s into $f_d$.

In considering partitioning of a decomposed representation, given a window function $w_i$, a decomposed representation $f_d(\Psi, X)$, and the ROBDD array $\Psi_{bdd}$ of f, $f_i$ is sought such that the ROBDD representing $f_i = w_i \wedge f_i$ is smaller than f. It can be shown that all $w_i$, which may be nothing but cubes, may satisfy this requirement.

Given $f_d$, $\Psi_{bdd}$, and $w_i$s, the cofactors $\psi_{w_i}$ and $f_{d_w i}$ may be created. By composing $\psi_{bdd_w i}$, in $F_{dwi}$, the partition function $f_i = f_{w_i} f_i = f_{wi}$ may be achieved. Thus, given a set of window functions $w_i$, the partitioned-ROBDD $x_f$ of f may be given by $\chi_f = \{(w_i, w_i \wedge f_{wi}) | 1 \leq i \leq k\}$. It is generally easy to check that the above definition satisfies all the conditions of Definition 1.

If $w_i$ is a cube, $f_i$ has a smaller size than the ROBDD for f. Also, the ROBDD representing $w_i$ has k internal nodes where k is the number of literals in $w_i$. Because $w_i$ and $f_{wi}$ have disjoint support, $|\bar{f}_i| = w_i \wedge f_i| = (k + |f_i|) \approx |f_i|$. Also, because each intermediate result of building $f_i$ will be smaller than that of building f, the intermediate peak memory requirement is also reduced. This may not be true in the presence of dynamic variable reordering when f and $f_i$ can have different variable orderings. In practice, because dynamic variable reordering operates on smaller graphs in the case of partitioning, it is even more effective.

When the window function is a more complex function of PIs than a cube, $f_i = f_{w_i}$ may be used. $f_{w_i}$ is the generalized cofactor of f on $w_i$. The generalized cofactor of f on $w_i$ is generally much smaller than f. But in the example case provided, the size of the $i^{th}$ partitioned-ROBDD $|\bar{f}_i|$ can be $O(|w_i||f_i|)$ in the worst case. To avoid this, while using general window functions, $w_i$s may be used, which is generally small.

With regards to the selection of window functions, after deciding how to construct the partition function from a given window function, methods to obtain appropriate window functions may be evaluated. The methods may be divided into two categories: a priori selection and "explosion" based selection.

In a priori partitioning, a predetermined number of primary inputs (PIs) is selected to partition. If it is decided to partition on 'k' PIs, then $2^k$ partitions are created that correspond to all the binary assignments of these variables. For example, if it is decided to partition on $x_1$ and $x_2$, four partitions may be created: $x_1 x_2, x_1 \overline{x_2}, \overline{x_1} x_2$ and $\overline{x_1 x_2}$. For a given window function of this type, partitioned-ROBDDs can be created, which are guaranteed to be smaller than the monolithic ROBDD. Because only one partition needs to be in the memory at a given time, success is highly likely in the selected space. The reduction in memory is large and may be accompanied by an overall reduction in the time taken to process all partitions as well.

Variables should be selected that maximize the partitioning achieved while minimizing the redundancy that may arise in creating different partitions independently. This reflects a fundamental principle of many divide and conquer approaches. The cost of partitioning a function f on variable x may be defined as:

$$\text{cost}_x(f) = \alpha[p_x(f)] + \beta[r_x(f)] \quad (2)$$

where $p_x(f)$ represents the partitioning factor and is given by, $$p_x(f) = \max\left(\frac{|f_x|}{|f|}, \frac{f_{\bar{x}}}{f}\right) \quad (3)$$

and $r_x(f)$ represents the redundancy factor and is given by, $$r_x(f) = \left(\frac{|f_x + f_{\bar{x}}|}{|f|}\right) \quad (4)$$

A lower partitioning factor may be beneficial as it implies that the worst of the two partitions is small and similarly a lower redundancy factor is beneficial because it implies that the total work involved in creating the two partitions is less. The variable x that has the lower overall cost is chosen for partitioning.

For a given vector of functions F and a variable x, the cost of partitioning may be defined as:

$$\text{cost}_x(F) = \sum_{i=1}^{k} \text{cost}_x(f_i)$$

The PIs may be numbered in increasing order of their cost of partitioning $f_d$ and $\Psi$ and the best 'k' (where 'k' is a predetermined number specified by the user) may also be selected. Using a similar cost function, PI variables may be selected as well as pseudo-variables, such as a.$\psi_{i_{bdd}}$ expressed in terms of PIs, to create partitioned-ROBDDs. In the example case, the cofactor operations may become generalized cofactor operations for window functions that are non-cubes. This type of selection, where all the PIs are ranked according to their cost of partitioning $f_d$ and $\Psi$, is called a static partition selection.

Alternatively, a dynamic partitioning strategy may be used in which the best PI (e.g. x) is selected based on $f_d$ and $\Psi$ and then the subsequent PIs are recursively selected based on $f_{d_x}$ and $\Psi_x$ in one partition and in $f_{d_{\bar{x}}}$ and $\Psi_{\bar{x}}$ in the other partition. The dynamic partitioning method may require an exponential number of cofactors and can be cost-prohibitive in certain circumstances. The cost can be somewhat reduced by exploiting the fact that the only values that are of interest are the sizes of the cofactors of $f_d$ and $\psi_{i_{bdd}}$s. An upper bound on the value of $|f_{d_x}|$ can be calculated by traversing the ROBDD of $f_d$ and taking the x=1 branch whenever the node with variable id corresponding to x is encountered. The method does not give the exact count as the BDD obtained by traversing the ROBDD in this manner is not reduced. One advantage of such an implementation is that no new nodes need to be created and the traversal is relatively quick.

Partitions may be created such that the number of partitions are chosen dynamically. In one case, each time the BDDs blow-up, partitioning is executed dynamically using splitting variables, chosen in the increment of 1, until the BDD blow-up is deemed to be circumvented.

In explosion based partitioning, the $\psi_{i_{bdd}}$s in $f_d$ is successively composed. If the graph size increases significantly for some composition (e.g. $\Psi_j$), a window function may be selected (e.g. w) based on the current $f_d$ and $\psi_{j_{bdd}}$. The window functions may be either a PI and its complement or some $\psi_{k_{bdd}}$ and its complement that is expressed in terms of PIs only and that has a small size.

Once the window function w is obtained, two partitions $(w \wedge f_{d_w}, \psi_w)$, and $(\overline{w} \wedge f_{d_{\overline{w}}}, \psi_{\overline{w}})$ may be created and the routine on each of the partitions may be recursively recalled. In general, if the resulting BDD after composition is more than ten times larger then the sum of all the previous decomposed BDDs that have already been composed and the size of original decomposed BDD, explosion based partitioning may be executed.

In a priori variable selection, as well as explosion based partitioning, a fixed number of splitting variables is determined. Explosion based partitioning followed by a fixed number of primary input variables based partitioning (or a vice-versa process) may then be executed. The explosion based partitioning can use both the primary inputs as well as pseudo-variables/decomposition points.

After selecting a window function and creating the decomposed representation for the $i^{th}$ partition given by $f_{d,i}$ and $\psi_{w_i}$, the final step is to compose $\psi_{w_i}$ in $f_{d,i}$, i.e., $f_{d,i}(\psi, X)(\psi \leftarrow \psi_{bdd,i})$. Although, the final ROBDD size is constant for a given variable ordering, the intermediate memory requirement and the time for composition may be a strong function of the order in which the decomposition points are composed. For candidate variables that can be composed into $f_d$, a cost can be assigned that estimates the size of the resulting composed ROBDD. The variable with the lowest cost estimate may be composed. A decomposition variable may be chosen that leads to the smallest increase in the size of the support set of the ROBDD after composition.

At each step, candidate $\psi_s$ may be restricted for composition to those decomposition points that are not present in any of the other $\psi_{bdd}$s. This may ensure that a decomposition variable needs to be composed only once in $f_d$.

Figure 2:
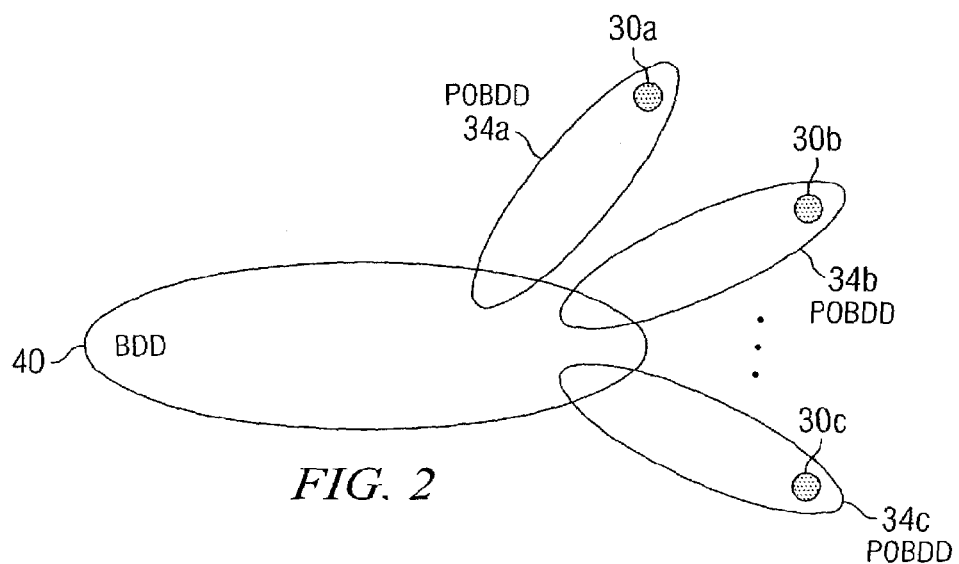
FIG. 2 is a simplified schematic diagram illustrating an example interaction between one or more elements that may be included within the system.

FIG. 2 is a simplified schematic diagram illustrating an example interaction between one or more elements that may be included within system 10. FIG. 2 illustrates a set of example starting points 30a–c, a set of POBDD elements 34a–c, and a BDD element 40. These elements are abstractly represented and are intended to reflect general principles associated with system 10. POBDD techniques may be employed and an analysis may be executed for such an architecture. POBDD elements 34a–c represent leaves or partitions associated with target circuit 12. Each POBDD element 34a–c may be coupled to BDD element 40 and each may reflect the image computation procedure for a reachability analysis provided by system 10. The reachability analysis may be executed for sequential circuits in formal and semi-formal verifications.

For formal verification, it may be generally appropriate that reachability based analyses be performed on a given segment of target circuit 12. The query reflects an investigation as to which states are reachable from an initial state. In general, the reachability analysis may present a difficult problem. The reachability analysis may be executed by constructing a set of transition relations, and by conjuncting every member of the set. Primary inputs and present state variables of the circuit may be existentially quantified from this formula. Conceptually, the conjunction may be executed first and the quantification may be executed second. Graphs during this analysis (particularly the conjunction phase) may blowup or become excessively large. Due to the blowup, BDD-based formal verification may be impractical. System 10 avoids these problems by providing a local partitioning of the image. Image computation issues may be solved with use of POBDD data structure 14 in order to solve the conjunction issue. Each leaf (POBDD elements 34-c) of a corresponding POBDD structure represents a subset of the final image. Each leaf may reflect the completion of conjunction and quantification operations. Each leaf (or subset of the image) may be transferred to a separate manager with particular capabilities after computation has been completed. Separate computations can be made for each leaf using a separate variable order (where possible) Alternatively, leaves may be combined and fed to appropriate processors in accordance with particular needs. Appropriate splitting may be executed on primary inputs, state variables, or on local decomposition variables.

Images may be disjuncted under a common order, whereby the disjunction offers an inexpensive operation for verification of target circuit 12. The conjunction/quantification process is generally faster because it is happening over a partitioned structure, with potential use of separate orders. Practical verification may also be achieved and provides a practical functionality for any verification tool.

System 10 may provide an enhanced verification process that avoids expensive AND operations. AND operations generally blowup during computation phases but become smaller after the quantification phase. This presents a significant issue for formal verification approaches. In certain cases, graphs may become so large during the image computation that even though they may later become smaller, the verification procedure has already been aborted. System 10 obviates these difficulties in providing a local partitioning that is significantly faster and substantially less expensive and that may invoke an OR function.

For purposes of teaching, it is helpful to explain some of the operations that are executed in conjunction with POBDD techniques. Functions generally map one domain to a co-domain. Variables may be represented in terms of X and outputs may be represented in terms of Y. Each combination of X may result in some representation of Y. For each combination of X, there may be a unique combination that results and this may define the function. An image is what is produced as a result of certain operations associated with the function. An operation may be applied on the domain and what results is an image. For example, a number of states may be present and from those states many other states may be reached. From ten states, a thousand states may be reached within target circuit 12. The thousand states may be considered as reflecting an image associated with the ten states.

The image operation may be considered as a prism or a mirror that provides some reflection in order to project the corresponding image. For a given image, an object and a mirror are employed to derive the image. The object may be referred to as the starting ten states, whereby the mirror is the operation and the thousand states is the image set. In a similar fashion, preimaging operations may be defined. The preimage in the example provided may be represented by the one thousand states. The operation is still represented by the mirror and an object may be derived using these two variables. Thus, in the case of images, an object and a mirror are present and the reflection is sought. In the case of preimaging, the reflection and the mirror are present and what is being sought is the original object that projected the image.

The image operation in the case of a states-based analysis may be referred to as a transition/relation operation. The transition/relation operation may link the transitions that are possible in a given state space, where there are certain rules that prohibit moving from state one to state ten because links are not present. The transitions that are possible and impossible may then be captured. Thus, the mirror (transition/relation operation) may indicate what transitions are possible in the system/circuit/state.

There are only some states that may be accessed after one application of a transition/relation operation. Accordingly, after applying the transition/relation operation, movement may be effectuated from that point to a greater depth. Similarly, from state one thousand, it may be determined the values of the original states using the transition/relation operation. Accordingly, a preimage may be achieved for a given set of states. The image is the reflection of the states as provided by the mirror (transition/relation operation). Imaging and/or preimaging techniques may be used in order to determine what is deep within target circuit 12.

In an example embodiment, 'deeper' generally refers to a depth parameter associated with target circuit 12, which is being analyzed. Certain states may be reachable and other states may be incapable of being reached without performing preliminary tasks first. States generally have different depths because some fixed point calculations may terminate early and some others may extend far into a given test circuit. This may be based on the characteristics of a given function. The given function may be configured such that under some window or sub-spaces, the analysis may continue for an extended depth. Additionally, provenly deep states and a heuristical set of states may be present. The provenly deep states generally require a significant amount of work in order to determine if they are deep. A heuristical set of states generally provides no guarantee as to depth. Heuristical states may be provided (potentially quickly), however, it is unknown whether these states are deep. Thus, a balance is generally achieved between these two principles. Neither speed nor depth may be neglected in executing properly verification techniques. By using POBDD data structure 14, some states may be calculated that are potentially deep or certain states may be projected as 'usually' deep and those states may be targeted for sampling.

Appropriate time intervals may also be provided in conjunction with the sampling of multiple sub-spaces within a given circuit under test. A certain amount of time may be configured in order to evaluate various sub-spaces within a target. Once the time interval has expired, the process may stop and a determination may be made. The time interval may be based on expediency issues or practicality parameters associated with a given verification process. Where no deep states are found during the designated time interval, the program may be run in a difficult mode that includes a larger time out value. Alternatively, the manner in which the selection was executed may change such that any of the already sampled sub-spaces (or types of spaces) are not revisited. By giving a guarantee or a fixed proof that a deep state will be encountered, a significant gain in efficiency may be achieved with a minimal loss. This gain in efficiency may be disproportionately high as compared to the loss.

Figure 3:
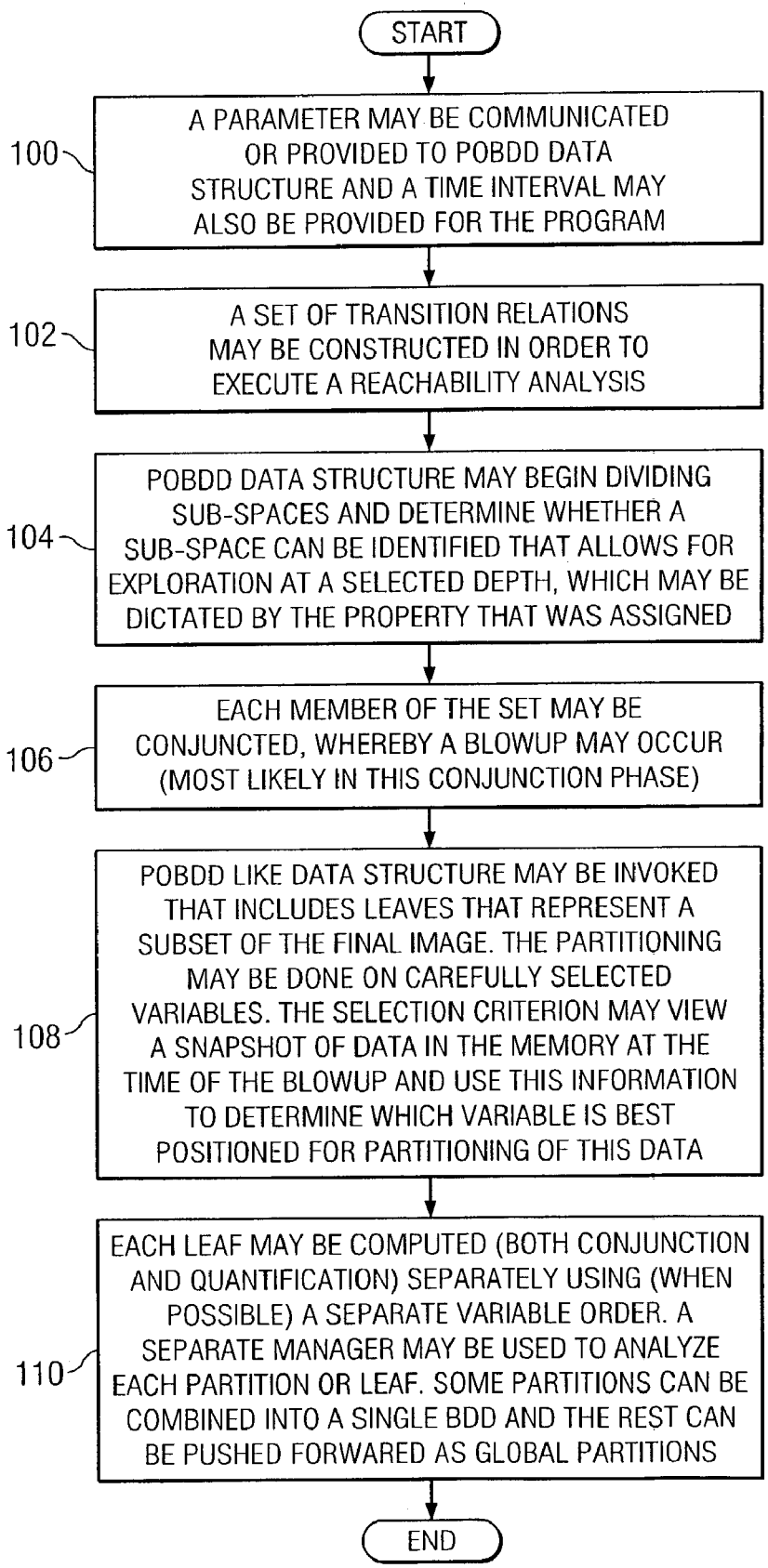
FIG. 3 is a flowchart illustrating a series of example steps associated with a method for executing image computation associated with a target circuit in accordance with one embodiment of the present invention.

FIG. 3 is a simplified flowchart illustrating a series of example steps associated with a method for executing image computation associated with target circuit 12. The method may begin when a designer evaluates a particular circuit, such as target circuit 12, and focuses on some property that needs to be verified. POBDD data structure 14 may be invoked at step 100. A parameter may be communicated or provided to POBDD data structure 14 and a time interval may also be provided for the program. For example, it may be designated that the program being executed by POBDD data structure 14 should not exceed five-thousand seconds.

A set of transition relations may be constructed in order to execute a reachability analysis at step 102. At step 104, POBDD data structure 14 may begin dividing sub-spaces and determine whether a sub-space can be identified that allows for exploration at a selected depth, which is potentially provided with or dictated by the property that was assigned. If this process is executed within the time interval, the process may be deemed to be satisfied. In cases where the program is not executed within the time interval, the maximum depth achieved may be displayed. Alternatively, the time out interval may be modified and the program performed again. In other cases, the sub-space sampling location may be appropriately changed such that an optimal depth is reached.

At step 106, each member of the set may be conjuncted, whereby a blowup may occur. This blowup may most likely occur in the conjunction phase. At step 108, POBDD data structure 14 may be invoked and inclusive of leaves that represent a subset of the final image. The partitioning may be done on carefully selected variables. The selection criteria (included in any suitable place, such as algorithm element 16 for example) may glean or retrieve a snapshot of data in the memory at the time of blowup. This may be reflective of both fully and partially formed BDDs. This information may be used to determine which variable is best positioned for partitioning of the data. Additionally, partitioning may be executed based on primary inputs, state variables, or local decomposition variables for example. Thus, variables may be carefully selected from a subset of variables in order to identify more advantageous variables, which may be used to initiate the verification process.

At step 110, each leaf may be computed (both conjunction and quantification) separately. This may be executed using (when possible) a separate variable order. A separate manager may also be used to analyze each partition or leaf. Some partitions may be combined into a single BDD and the rest may be pushed forward as global partitions. This provides an inexpensive operation, whereby all images are disjuncted (ORed) under a common order. Additionally, each subset of the image (or leaf) may be transferred as soon as it reaches completion. This allows (even in cases where some subsets blowup) orthogonal subsets, which were not difficult, to achieve partial image analysis; this may be valuable to the tester or designer. It may be identified that a property violation has been encountered, or an integrity parameter, potentially reflected by a resultant, may be produced by system 10 that identifies imperfections or flaws associated with target circuit 12. This information may then be used in order to correct or amend problems or specifications associated with the manufacturing or design process. Alternatively, the information or resultant produced by POBDD data structure 14 may be used to fix a corresponding product such that it meets the criteria provided by the designer.

The random sampling of a given area provides a reasonable verification evaluation associated with target circuit 12. The sampling is not necessarily a guarantee, as other sub-spaces could have been sampled and other errors could have been encountered. Based on practically concerns, a product designer or a digital system operator may determine the scope and accuracy parameters associated with a given verification procedure.

Some of the steps illustrated in FIG. 3 may be changed or deleted where appropriate and additional steps may also be added to the flowchart. These changes may be based on specific verification architectures or particular local partitioning arrangements and configurations and do not depart from the scope or the teachings of the present invention.

Although the present invention has been described in detail with reference to particular embodiments, system 10 may be extended to any scenario in which verification is sought for a given target circuit, device, component, or element that has been designed or manufactured to perform a selected task or to include a designated property. Moreover, significant flexibility is provided by system 10 in that any suitable one or more components may be replaced with other components that facilitate their operations. For example, although system 10 has been described with reference to particular components such as POBDD data structure 14, and algorithm element 16, these elements may be provided in a single integral unit where appropriate or replaced with devices that effectuate their functions. POBDD data structure 14 may be used with any other suitable checking or simulation protocol in order to enhance the verification capabilities thereof. Additionally, designer information 24 may be communicated or otherwise offered to POBDD data structure 14 in any appropriate manner.

In addition, although system 10 has been described with reference to one or more discreet components, additional intermediate components may be provided to system 10 in order to facilitate the processing operations thereof. For example, additional components may be used in the communication of information between any suitable element and POBDD data structure 14. The present invention enjoys considerable versatility in that these components may be capable of operating in conjunction with various intermediate processing elements, in any suitable fashion, that facilitate the verification procedure for a given target element or object.

Numerous other changes, substitutions, variations, alterations, and modifications may be ascertained by those skilled in the art and it is intended that the present invention encompass all such changes, substitutions, variations, alterations, and modifications as falling within the spirit and scope of the appended claims. Moreover, the present invention is not intended to be limited in any way by any statement in the specification that is not otherwise reflected in the appended claims.

What is claimed is

1. An apparatus for verifying a property associated with a target circuit, comprising:
a partitioned ordered binary decision diagram (POBDD) data structure that receives information associated with a target circuit, the information identifying a property within the target circuit to be verified, the POBDD data structure executing one or more operations to generate a set of transition relations for performing a reachability analysis associated with the target circuit, the POBDD data structure partitioning an image associated with the target circuit into a plurality of leaves each representing a subset of a final image to be generated by the POBDD data structure, wherein the POBDD data structure computes an analysis for one or more of the leaves using a selected one or both of conjunction and quantification operations separately.

2. The apparatus of claim 1, further comprising:
an algorithm element coupled to the POBDD data structure, wherein the algorithm element includes one or more algorithms that may be executed in order to verify the property included within the target circuit.

3. The apparatus of claim 1, wherein the partitioning is executed based on a selected one of primary inputs, state variables, and local decomposition variables associated with the target circuit.

4. The apparatus of claim 1, wherein one or more of the leaves are computed separately using a separate variable order.

5. The apparatus of claim 1, further comprising:
a plurality of managers, wherein one or more of the managers analyzes a selected one of the leaves, and wherein one or more of the leaves are combined into a single BDD, one or more of the leaves being transferred after the computation has been completed.

6. The apparatus of claim 1, wherein local partitioning is used in order to combine one or more windows, associated with one or more of the leaves, into a common window.

7. The apparatus of claim 1, wherein local partitioning is used in order to glean information reflecting global partitioning patterns associated with one or more of the leaves, and wherein dynamic partitioning is used in order to generate additional partitions associated with one or more of the leaves.

8. The apparatus of claim 1, wherein the POBDD data structure monitors a computation operation such that when a blow-up occurs, information associated with the blow-up may be recorded and used at a subsequent time when abnormal behavior is exhibited by one or more of the leaves, the information being included in an anticipatory list that includes a cost calculation.

9. A method for verifying a property associated with a target circuit, composing:
receiving information associated with a target circuit, the information identifying a property within the target circuit to be verified;

executing one or more operations for generating a set of transition relations for performing a reachability analysis associated with the target circuit;

partitioning an image associated with the target circuit into a plurality of leaves each representing a subset of a final image to be generated by a partitioned ordered binary decision diagram (POBDD) data structure; and computing an analysis of one or more of the leaves using a selected one or both of conjunction and quantification operations separately.

10. The method of claim 9, further comprising:
executing one or more algorithms in order to verify the property included within the target circuit.

11. The method of claim 9, wherein the partitioning is executed based on a selected one of primary inputs, state variables, and local decomposition variables associated with the target circuit.

12. The method of claim 9, wherein one or more of the leaves are computed separately using a separate variable order.

13. The method of claim 9, further comprising:
transferring one or more of the leaves after the computation has been completed.

14. The method of claim 9, further comprising:
producing a resultant that reflects an integrity parameter associated with the property being verified, the integrity parameter identifying whether one or more errors are present in the target circuit.

15. Software for verifying a property associated with a target circuit, the software being embodied in a computer readable medium and including computer code such that when executed:
receives information associated with a target circuit, the information identifying a property within the target circuit to be verified;

executes one or more operations for generating a set of transition relations for performing a reachability analysis associated with the target circuit;

partitions an image associated with the target circuit into a plurality of leaves each representing a subset of a final image to be generated a partitioned ordered binary decision diagram (POBDD) data structure; and computes an analysis of one or more of the leaves using a selected one or both of conjunction and quantification operations separately.

16. The medium of claim 15, wherein the code executes one or more algorithms in order to verify the property included within the target circuit.

17. The medium of claim 15, wherein the partitioning is executed based on a selected one of primary inputs, state variables, and local decomposition variables associated with the target circuit.

18. The medium of claim 15, wherein one or more of the leaves are computed separately using a separate variable order.

19. The medium of claim 15, wherein the code:
transfers one or more of the leaves after the computation has been completed.

20. The medium of claim 15, wherein the code:
produces a resultant that reflects an integrity parameter associated with the property being verified, the integrity parameter identifying whether one or more errors are present in the target circuit.

21. A system for verifying a property associated with a target circuit, comprising:
- means for receiving information associated with a target circuit, the information identifying a property within the target circuit to be verified;
- means for executing one or more operations for generating a set of transition relations for performing a reachability analysis associated with the target circuit;
- means for partitioning an image associated with the target circuit into a plurality of leaves each representing a subset of a final image to be generated by a partitioned ordered binary decision diagram (POBDD) data structure; and
- means for computing an analysis of one or more of the leaves using a selected one or both of conjunction and quantification operations separately.

22. The system of claim 21, further comprising:

means for executing one or more algorithms in order to verify the property included within the target circuit.

23. The system of claim 21, further comprising:

means for transferring one or more of the leaves after the computation has been completed.

24. The system of claim 21, further comprising:

means for producing a resultant that reflects an integrity parameter associated with the property being verified, the integrity parameter identifying whether one or more errors are present in the target circuit.

* * * * *

UNITED STATES PATENT AND TRADEMARK OFFICE
CERTIFICATE OF CORRECTION

PATENT NO. : 7,032,197 B2  Page 1 of 1
APPLICATION NO. : 10/454207
DATED : April 18, 2006
INVENTOR(S) : Jawahar Jain et al.

It is certified that error appears in the above-identified patent and that said Letters Patent is hereby corrected as shown below:

Column 6, Line 45, after "for" delete "f $\hat{X}$ g where $\hat{X}$" and insert -- f $\otimes$ g where $\otimes$ --.

Column 7, Line 37, delete "f:B nB" and insert -- f:B$^n \rightarrow$B --.

Column 7, Line 42, after "function pairs," delete "$\chi f = \{(\omega_1, \overline{f}_1)\ldots,(\omega_k, \overline{f}_k)\}$" and insert -- $\chi_f = \{(\omega_1, \overline{f}_1),\ldots,(\omega_k, \overline{f}_k)\}$ --.

Column 8, Line 38, after "the array of" delete "=104 $i_{bdd} w_i$" and insert -- $\psi_{i_{bdd} w_i}$ --.

Column 8, Line 41, delete " $f_d(\Psi, X) \bullet (\psi_i \leftarrow \psi_{i_{bdd}}) = \overline{\psi_{i_{bdd}}} \bullet f_{d_{\overline{\psi_i} + \psi_{i_{bdd}}}} \bullet \eta_{d_{\psi_i}^*}$ " and insert -- $f_d(\Psi, X) \bullet (\psi_i \leftarrow \psi_{i_{bdd}}) = \overline{\psi_{i_{bdd}}} \bullet f_{d_{\overline{\psi_i}}} + \psi_{i_{bdd}} \bullet f_{d_{\psi_i}^*}$ --.

Signed and Sealed this

Twenty-sixth Day of August, 2008

JON W. DUDAS
*Director of the United States Patent and Trademark Office*